United States Patent
Dimitrov et al.

(10) Patent No.: US 8,519,376 B2
(45) Date of Patent: Aug. 27, 2013

(54) NONVOLATILE RESISTIVE MEMORY DEVICES

(75) Inventors: Dimitar Velikov Dimitrov, Edina, MN (US); Insik Jin, Eagan, MN (US); Haiwen Xi, Prior Lake, MN (US)

(73) Assignee: Seagate Technology LLC, Cupertino, CA (US)

( * ) Notice: Subject to any disclaimer, the term of this patent is extended or adjusted under 35 U.S.C. 154(b) by 202 days.

(21) Appl. No.: 12/606,681

(22) Filed: Oct. 27, 2009

(65) Prior Publication Data

US 2010/0102289 A1   Apr. 29, 2010

Related U.S. Application Data

(60) Provisional application No. 61/108,785, filed on Oct. 27, 2008.

(51) Int. Cl.
*H01L 27/26* (2006.01)

(52) U.S. Cl.
USPC ............... 257/5; 257/E27.104; 257/E27.006; 257/E21.665; 257/E21.679

(58) Field of Classification Search
USPC .......................................................... 257/5
See application file for complete search history.

(56) References Cited

U.S. PATENT DOCUMENTS

| | | | |
|---|---|---|---|
| 5,687,112 A | 11/1997 | Ovshinsky | |
| 6,849,891 B1 | 2/2005 | Hsu et al. | |
| 6,972,211 B2 | 12/2005 | Hsu et al. | |
| 7,995,371 B2 * | 8/2011 | Rinerson et al. | 365/148 |
| 2004/0026682 A1 * | 2/2004 | Jiang | 257/4 |
| 2005/0054138 A1 | 3/2005 | Hsu et al. | |
| 2006/0097288 A1 * | 5/2006 | Baek et al. | 257/208 |
| 2006/0171200 A1 * | 8/2006 | Rinerson et al. | 365/185.1 |
| 2006/0250836 A1 | 11/2006 | Herner et al. | |
| 2007/0120580 A1 * | 5/2007 | Kim et al. | 326/93 |
| 2007/0173019 A1 | 7/2007 | Ho et al. | |
| 2008/0185573 A1 * | 8/2008 | Sun et al. | 257/4 |
| 2008/0211036 A1 * | 9/2008 | Zhao et al. | 257/379 |
| 2008/0278990 A1 * | 11/2008 | Kumar et al. | 365/148 |
| 2009/0026433 A1 * | 1/2009 | Chiang | 257/2 |
| 2009/0026434 A1 * | 1/2009 | Malhotra et al. | 257/2 |

OTHER PUBLICATIONS

J. M Bian et al, p-type ZnO films by monodoping of nitrogen and ZnO-based p-n homojunctions, Appiled Physics Letters, Nov. 1, 2004, pp. 4070-4072, vol. 85, No. 18, American Institute of Physics.
J. C. Bruyere et al, Switching and negative resistance in thin films of nickel oxide, Applied Physics Letters, Jan. 1, 1970, pp. 40-43, vol. 15, No. 1, American Institute of Physics.

(Continued)

*Primary Examiner* — Calvin Lee
*Assistant Examiner* — Abul Kalam
(74) *Attorney, Agent, or Firm* — Fredrikson & Byron PA

(57) ABSTRACT

Nonvolatile resistive memory devices are disclosed. In some embodiments, the memory devices comprise multilayer structures including electrodes, one or more resistive storage layers, and separation layers. The separation layers insulate the resistive storage layers to prevent charge leakage from the storage layers and allow for the use of thin resistive storage layers. In some embodiments, the nonvolatile resistive memory device includes a metallic multilayer comprising two metallic layers about an interlayer. A dopant at an interface of the interlayer and metallic layers can provide a switchable electric field within the multilayer.

17 Claims, 7 Drawing Sheets

(56) References Cited

OTHER PUBLICATIONS

D. V. Dimitrov et al, Ferrimagnetism and defect clusters in Fe1-xO films, Physical Review B, Jun. 1, 1999—II, vol. 59, No. 22, The American Physical Society.

J. F. Gibbons et al, Switching properties of thin NiO films, Solid-State Electronics, Mar. 30, 1964, pp. 785-797, vol. 7, Pergamon Press, Great Britain.

Kohtaroh Gotoh et al, Pt/PZT/N-SrTiO3 Ferroelectric Memory Diode, Japanese Journal of Applied Physics, Jan. 1996, pp. 39-43, vol. 35, Part 1, No. 1A, Japan Society of Applied Physics.

D. C. Kim et al, Improvement of resistive memory switching in NiO using IrO2, Applied Physics Letters, Jun. 6, 2006, vol. 88, 232106, American Institute of Physics.

H. Kohlstedt et al, Theoretical current-voltage characteristics of ferroelectric tunnel junctions, Physical Review B, 29 Sep. 2005, vol. 72, 125341, The American Physical Society.

W. Y. Lee et al, High-current-density ITOx /NiOx thin-film diodes, Applied Physics Letters, Mar. 30, 1998, pp. 1584-1586, vol. 72, No. 13, American Institute of Physics.

\* cited by examiner

NONVOLATILE RESISTIVE MEMORY DEVICES

CROSS-REFERENCE TO RELATED APPLICATIONS

This application claims the benefit of U.S. Provisional Application No. 61/108,785, filed on Oct. 27, 2008, the content of which is hereby incorporated by reference in its entirety.

BACKGROUND

The amount of digital data and content which people generate and store has been increasing at a very large pace. It is believed that this trend will continue and will drive the need for reliable, large capacity, low power, and low cost storage media. Current technology, including Hard Disk Drives (HDD) and Flash memory have done very well in meeting this growing demand. However scaling and technological advances are becoming progressively more difficult and both technologies may face severe roadblocks in the future. Thus, many companies and research entities are constantly looking for an alternative storage technology that could be used in a large number of consumer electronics applications.

One type of emerging memory that could potentially address these and other pending issues is resistive nonvolatile memory. Resistive memory operates based upon the reversible and reproducible switching of a resistive storage element between a low resistance state (LRS) and a high resistance state (HRS). This effect can be used to implement a memory element where the LRS and HRS can correspond to binary logic states, e.g. "0" and "1."

SUMMARY

Embodiments of the invention are generally directed to nonvolatile resistive memory cells and devices. In one embodiment in accordance with the invention, a nonvolatile memory cell includes first and second electrodes and a resistive storage layer interposed between the first and second electrodes. The memory cell further includes a first separation layer interposed between the first electrode and the resistive storage layer and a second separation layer interposed between the resistive storage layer and the second electrode.

These and various other features and advantages will be apparent from a reading of the following detailed description.

BRIEF DESCRIPTION OF THE DRAWINGS

The following drawings are illustrative of particular embodiments of the invention and therefore do not limit the scope of the invention. The drawings are not to scale (unless so stated) and are intended for use in conjunction with the explanations in the following detailed description. Embodiments of the invention will hereinafter be described in conjunction with the appended drawings, wherein like numerals denote like elements.

DETAILED DESCRIPTION

The following detailed description is exemplary in nature and is not intended to limit the scope, applicability, or configuration of the invention in any way. Rather, the following description provides practical illustrations for implementing exemplary embodiments of the present invention. Examples of constructions, materials, dimensions, and manufacturing processes are provided for selected elements, and all other elements employ that which is known to those of skill in the field of the invention. Those skilled in the art will recognize that many of the examples provided have suitable alternatives that can be utilized.

It should be understood that, as used herein, the terms first, second, etc. are used merely to distinguish one element from one another. Thus, elements including such terms should not be limited by these names. For example, a first separation layer could be termed a second separation layer, and vice versa, without departing from the teachings of this disclosure.

Moreover, spatially relative terms such as, "beneath", "below", "above", "top", "bottom", and the like may be used herein for ease of description to describe an element's and/or a feature's relationship to another element and/or feature as illustrated in the figures. It will be understood that the spatially relevant terms are intended to encompass different orientations of the device in use or operation, in addition to the orientation depicted in the figures.

Figure 1:
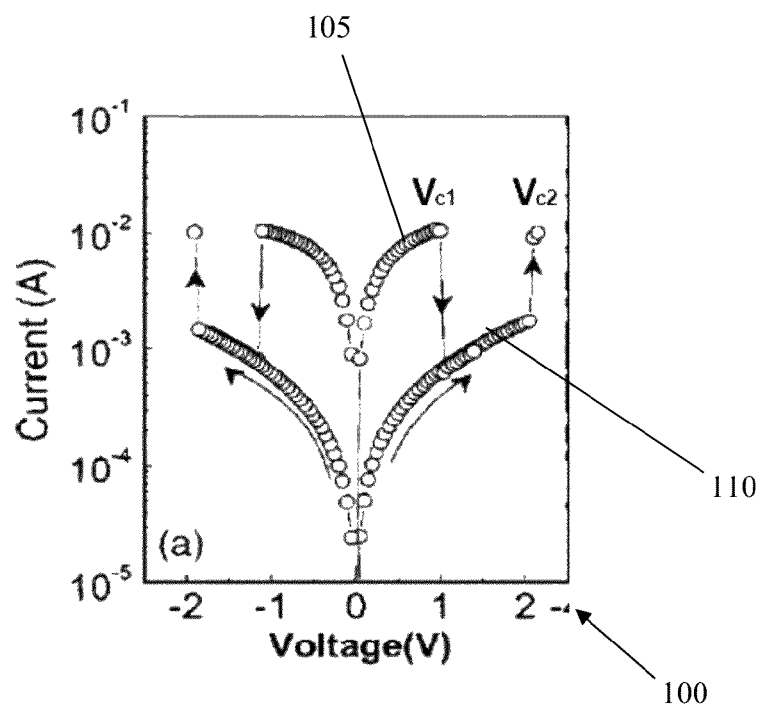
FIG. 1 is a plot illustrating the operation of a resistive memory cell.

Referring to FIG. 1, a hysteresis plot 100 is shown illustrating the general operation of a resistive memory cell. Generally, resistive memory cells operate along a pair of curves 105, 110 corresponding to operation in the LRS and HRS, respectively. For example, operation along the LRS curve 105 may correlate with a binary "1" and operation along the HRS curve 110 may correlate with a binary "0". To transition between states, a voltage can be applied to the memory cell which exceeds the set voltage threshold $V_{c2}$ or the reset voltage threshold $V_{c1}$. The application of a voltage greater than set voltage threshold $V_{c2}$ to a memory cell operating along the HRS curve 110, e.g. representing binary "0", causes the cell to transition to LRS operation 105, e.g. to binary "1". The application of a voltage greater than reset voltage threshold $V_{c1}$ but less than set voltage threshold $V_{c2}$ to a memory cell operating along the LRS curve 105, e.g. representing binary "1", causes the cell to transition to HRS operation 110, e.g. to binary "0". The difference between the threshold voltages $V_{c1}$, $V_{c2}$ can be referred to as the "switching window." To read the current state of the cell, a voltage can be applied that is less than the reset voltage threshold $V_{c1}$.

In the hysteresis plot 100 of FIG. 1, particular voltage and current levels are used to describe the operation of a resistive memory cell for purposes of explanation only. It should be understood that embodiments of the invention are not limited to the voltage and current levels shown in FIG. 1. In this case, reset voltage threshold $V_{c1}$ is approximately 1 V and set voltage threshold $V_{c2}$ is approximately 2 V. Accordingly, a switching window of approximately 1 V is provided. Such a device can be said to have a switching factor (i.e. the ratio of set voltage threshold $V_{c2}$ to reset voltage threshold $V_{c1}$) of approximately 2 to 1. It should be understood and will be described further below, that while devices according to embodiments of the present invention exhibit a hysteresis plot substantially similar to that shown in FIG. 1, the threshold values $V_{c1}$, $V_{c2}$ and switching factors associated with embodiments of the invention can vary significantly from the values indicated by FIG. 1.

It is the storage layer of resistive memory cells that provides the variable resistance of the device. Generally, the storage layer comprises a film that exhibits current-induced, bi-stable resistance effects or voltage-controlled negative resistance phenomena. In particular, this phenomenon has been observed in some metal oxide compounds (e.g. $Nb_2O_5$, $TiO_2$, $Al_2O_3$, $Ta_2O_5$, $Cu_2O$, $NiO_2$, Cr doped $SrZrO_3$, and other transition metal oxides (TMOs)), ferroelectric thin film heterostructures, and polymers films.

To produce output according to the hysteresis plot 100 of FIG. 1, the storage layer operation can be thought of as the operation of an insulating layer having a plurality of charge trapping mechanisms interspersed therein. For example, in TMO film storage layers, the TMO material comprises a p-type semiconductor which is mediated by charge transfer between transition metal (TM) states, i.e. between $TM^{2+}$ and $TM^{3+}$ states. Stoichiometric TMO has a rock salt structure that is insulating because the stoichiometric crystal lattice includes only TM in the $TM^{2+}$ state and oxygen. Thus, there are no available charge carriers to enable charge transfer. However, within the crystalline matrix of stoichiometric (i.e. insulating) TMO, non-stoichiometric TMO clusters ("defect clusters") form. Each defect cluster comprises a mixture of $TM^{2+}$ and $TM^{3+}$ states such that the defect cluster is capable of trapping charge. Within thin film TMO layers, defect clusters form within a matrix of stoichiometric TMO.

Within the storage layer, some of the charge trapping mechanisms (e.g. defect clusters) are close enough together to provide paths for current to pass therethrough. Other charge trapping mechanisms are isolated within the insulating matrix (e.g. stoichiometric TMO). When no charge is trapped within the charge trapping mechanisms, a potential applied to the electrodes will cause current to flow through the paths within the storage layer relatively freely, i.e. the cell exhibits LRS operation along curve 105. However, when a sufficiently large electric potential (i.e. greater than reset threshold voltage $V_{c1}$) is applied to the memory cell, charge can tunnel through the insulating matrix and become trapped within the isolated charge trapping mechanisms. This trapped charge produces an electric field which electrons passing through the storage layer must overcome, resulting in elevated cell resistance. Accordingly, when the charge trapping mechanisms are charged, the memory cell exhibits HRS operation along curve 310.

Ideally, the charge trapped within the isolated charge trapping mechanisms will remain there indefinitely as the insulating matrix provides no leakage path from the charge trapping site. However, the trapped charge can be forced out of the charge trapping mechanism by the application of an electric potential greater than set voltage threshold $V_{c2}$. Generally, the set voltage threshold $V_{c2}$ is much greater than the reset voltage threshold $V_{c1}$. This is because the reset voltage needs only to overcome the tunnel barrier between the charge trapping mechanism of the storage layer (i.e. the defect clusters in a TMO layer) and the surrounding matrix (i.e. the stoichiometric TMO lattice in a TMO layer) while the set voltage $V_{c2}$ needs to overcome extra energy to pull the trapped electron from the binding energy of the charge trapping mechanism (i.e. the affinities of $O^-$, $TM^{2+}$, and $TM^{3+}$ and the specific local position of the defect clusters in a TMO storage layer).

Figure 2:
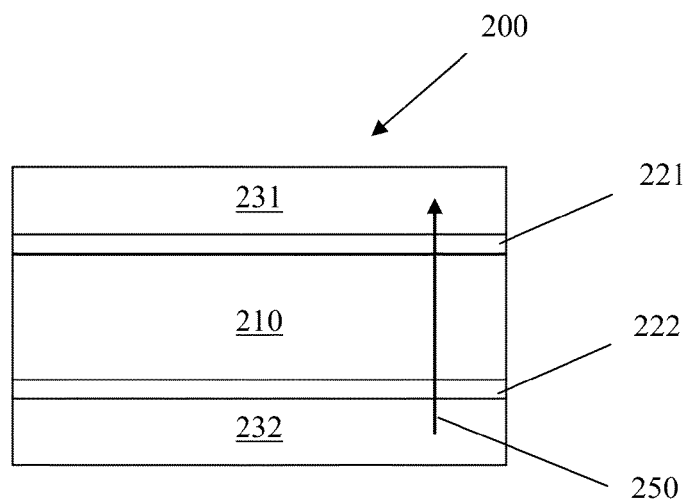
FIG. 2 is a schematic view of a nonvolatile resistive memory cell according to some embodiments.

Turning now to FIG. 2, a schematic view of a non-volatile resistive memory cell 200 is shown according to some embodiments. The memory cell 200 comprises a resistive storage layer 210 interposed between first and second separation layers 221, 222 which separate the storage layer 210 from first and second electrodes 231, 232. The first and second electrodes 231, 232 provide for electrical connection to the cell 200.

The storage layer 210 can comprise any material having bi-resistive states. Examples of storage layer materials include metal oxides, perovskite oxides, and ferroelectric thin films. In some embodiments, the storage layer 210 comprises a TMO storage layer, which contains defect clusters needed to trap charge. The TMO can comprise generally any $3d$ transition metal oxide such as Ni, Co, Fe, Cu, Ti, Cr, Mn, or V oxides. For example, some embodiments can comprise Ti $O_{2-x}$, $Ta_2O_5$, $NiO_x$, or $Nb_2O_5$. In addition, metal oxide storage layers can comprise $ITO_x$, ZnO, $CrO_2$, $HfO_2$, $ZrO_2$, $Fe_2O_3$, CoO, $SnO_2$, or 0.2% Cr—SrZrO. Exemplary perovskite oxides can include, for example, $Pr_{1-x}Ca_xMnO$ (e.g. $Pr_{0.7}Ca_{0.3}MnO_3$), $SrFeO_{2.7}$, $RuSr_2GdCu_2O_3$, $YBa_2Cu_3O_7$, Nd doped SrTiO, $La_{1-x}Sr_xMnO_3$, and $La_{0.7}Ca_{0.3}MnO_3$. Suitable ferroelectric thin films can include, for example, PZT, PLZT, $PbTiO_3$, $SrTiO_3$, BTO, $BaTiO_3$, $BaSrTiO_3$, BaBiO, $SrBi_4Ti_4O_{15}$, $SrBi_2Ta_2O_9$, SBNT ($SrBi_2TaNaO_3$), Pb(Mg, Nb)$O_3$, PNZT, $BaMgF_4$ and $KNO_3$.

It should be understood, that where embodiments are discussed with reference to a TMO storage layer, other storage layer materials and constructs can be substituted, unless specifically noted otherwise.

Some embodiments further comprise one or more separation layers 221, 222. The inclusion of separation layers 221, 222 can allow for the use of a storage layer 210 having a significantly reduced thickness. For example, in some embodiments the storage layer 210 can comprise approximately 20 Angstroms to approximately 50 Angstroms. Moreover, the separation layers 221, 222 can facilitate the formation of properly isolated charge trapping mechanisms within the storage layer 210. For example, in the case of a TMO storage layer, defect clusters formed within the storage layer are terminated from both sides by the separation layer such that trapped charge is much less capable of escaping. In some embodiments, charge trapping mechanisms naturally form at the interface of the storage layer 210 and the electrodes 231, 232. Based upon this interface charge trapping principle or mechanism, separation layers comprising an insulating layer can maintain a stable charge accumulation at the interfaces. Such insulating layers can prevent charge leakage from the storage layer 210 under thermal activations. Moreover, when voltage is applied across these insulating layers, they can conduct current via the electron tunneling phenomenon (for this reason, such layers may be referred to as "tunnel junctions" or "tunnel junction layers"). Thus, in some embodiments, the separation layers 221, 222 comprise insulating layers. Such insulating layers can comprise a thin (e.g. on the order of about 7 Angstroms to about 10 Angstroms) layer of an insulating material, such as, for example, $Al_2O_3$, $TiO_2$, or MgO. Preferably, such insulating layers are fabricated so as to be free of defect clusters or other charge trapping sites.

First and second electrodes 231, 232 provide for electrical connection to the memory cell 200. The electrodes 231, 232 can comprise generally any electrically conductive material. For example, the electrode can comprise Cu, Ag, Al, Ta, Pt, $SrRuO_3$, $RuO_2$, poly-Si, YBCO ($YBa_2Cu_3O_x$), IrO, LSCO ($La_{0.5}Sr_{0.5}CoO$), or TiN. In some embodiments, the first electrode 131 comprises a material different from the second electrode 232. Preferably, the electrode material is selected such that other component parts of a system incorporating the memory cell can interact with, and be easily fabricated about the memory cell.

In operation, the device 200 of FIG. 2 generally qualitatively operates according to the hysteresis plot 100 of FIG. 1. However, quantitatively, devices according to some embodiments operate on a significantly reduced power scale. For example, devices according to some embodiments, can exhibit reset and set voltage thresholds $V_{c1}$, $V_{c2}$ on the order of tens to several hundreds of millivolts (e.g. less than 100 mV). Initially the storage layer 210 is uncharged and current passing through the memory cell 200 (e.g. along arrow 250) experiences a resistance according to the LRS curve 105. Upon the application of a potential greater than reset voltage threshold $V_{c1}$, charge carriers can tunnel through the separation layer 221 and become trapped within the charge trapping mechanisms of the storage layer 210. This trapped charge creates a local electric field within the storage layer 210 which opposes current passing therethrough. Accordingly, the memory cell 200 has transitioned into the HRS (i.e. is operating along HRS curve 210). In this state, the separation layers 221, 222 prevent the trapped charge from leaking from the storage layer 210. To set the device (i.e. return to operation along the LRS curve 105), a voltage exceeding set voltage threshold $V_{c2}$ can be applied at the electrodes 231, 232. When this occurs, charge trapped within the charge trapping mechanisms of the storage layer is energized such that it can escape the binding energy of the charge trapping mechanisms and tunnel through the insulating matrix of the storage layer.

Preferably, reset and set threshold voltages $V_{c1}$, $V_{c2}$ are as small as possible allowing for low power operation. However, the memory cell should be configured to provide a relatively large enough switching window to ensure appropriate switching selectability. For example, devices according to some embodiments can exhibit a switching factor of 3 to 1 or greater. Accordingly, some embodiments can provide memory cells having reset and set voltage thresholds $V_{c1}$, $V_{c2}$ of less than 100 mV, and switching windows of at least 3:1 (e.g. $V_{c2}$=100 mV and $V_{c1}$=30 mV).

In addition, devices according to some embodiments can provide for improved data retention. Because, the separation layers 221, 222 prevent the formation of a leakage path from the storage layer 210 to the electrodes 231, 232, charge trapped within the storage layer 210 is much less likely to escape. Accordingly, data stored within the cell is more permanent. Some embodiments can provide for data retention of greater than $10^8$ cycles.

In some embodiments, the storage layer 210 can comprise a doped storage layer. Such embodiments can be configured to provide for reduced power operation. Doped storage layers can comprise, for example, a TMO layer wherein a small percentage (e.g. less than 10%) of the oxygen is substituted with a dopant, e.g. an element from the oxygen group having a smaller electron affinity, for example, S, Se, or Te. The dopant can serve as precipitating centers for the formation of defect clusters. However, due to their smaller electron affinity, trapped charge can be more easily extracted from these defect clusters thereby reducing the set voltage threshold $V_{c2}$ and providing lower power operation. In other embodiments, a small percentage the TM ions (e.g. less than 10%) can be substituted with larger metallic atoms which have smaller electron affinities, for example Ag, Au, Ru, Rh, Zr, Nb, Mo, Ta, or W.

Figure 3:
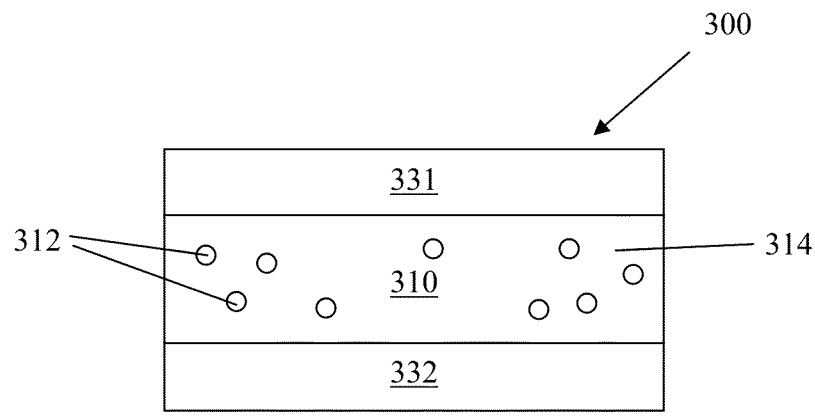
FIG. 3 is a schematic view of a nonvolatile resistive memory cell comprising a synthetic storage layer according to some embodiments.

In some embodiments, such as the memory cell 300 shown in FIG. 3, the storage layer can comprise a synthetic resistive switching storage layer 310 interposed between first and second electrodes 331, 332. The synthetic resistive switching layer 310 can comprise, for example, a granular film including a plurality of nano-sized grains 312 embedded in an insulating matrix 314. In such systems, the grains 312 comprise the charge trapping mechanisms and can be isolated within the insulating matrix 314. The insulating matrix 314 can comprise, for example, $SiO_2$, $Al_2O_3$, MgO or other insulating materials. The nano-grains 312 can comprise semiconductive grains (e.g. Si, Ge, ZnO, ITO ($In_2O_3/SnO_2$)), metallic grains, or some combination of semiconductive and metallic grains. In some embodiments, the nano-grains 312 are selected to be immiscible with the insulating matrix 314. For example, iron nanograins can be embedded within a silicon dioxide insulating matrix. The embodiment shown in FIG. 3 does not include separation layers as, in some embodiments, the insulating matrix 314 can sufficiently isolate the nano-grains 312 so that no separation layer is necessary. Alternatively, some embodiments can additionally include one or more separation layers as discussed above with regard to the embodiment of FIG. 2.

Figure 4:
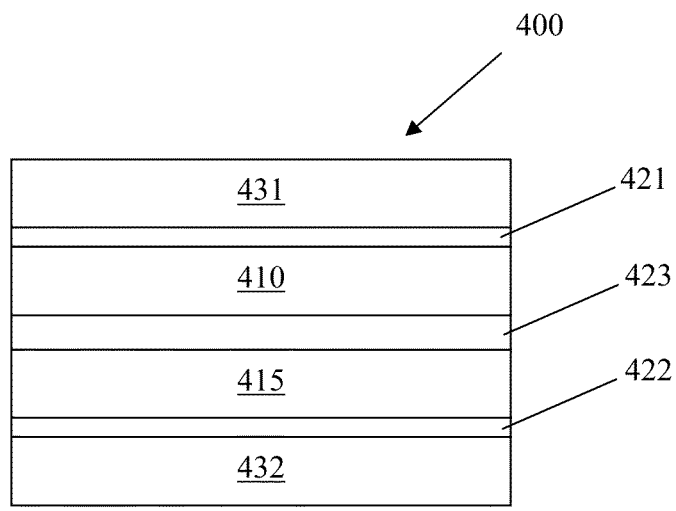
FIG. 4 is a schematic view of a nonvolatile resistive memory cell comprising a plurality of storage layers according to some embodiments.

FIG. 4 shows a schematic of another memory cell 400 according to some embodiments. In this embodiment, the memory cell comprises two storage layers 410, 415 interposed between the first and second electrodes 431, 432. Separation layers are interposed between the storage layers 410, 415 and the electrodes 431, 432 (e.g. separation layers 421, 422) as well as between the storage layers themselves (e.g. separation layer 423). The storage layers 410, 415 can comprise generally any of the materials described above with regard to the storage layers 210, 310 of FIGS. 2 and 3. In some embodiments, each of the storage layers comprise a different storage layer material. Likewise, electrodes 431, 432 and separation layers 421, 422, 423 can comprise any of the above-described materials and can be different or identical to one another. Further, while the shown memory cell 400 includes only two storage layers 410, 415, one can appreciate that some embodiments will include more than two storage layers, with each layer separated by a separation layer. Embodiments which include multiple storage layers separated by separation layers can provide for a higher resistance ratio (dR/R), allowing for improved device readability.

Figure 5:
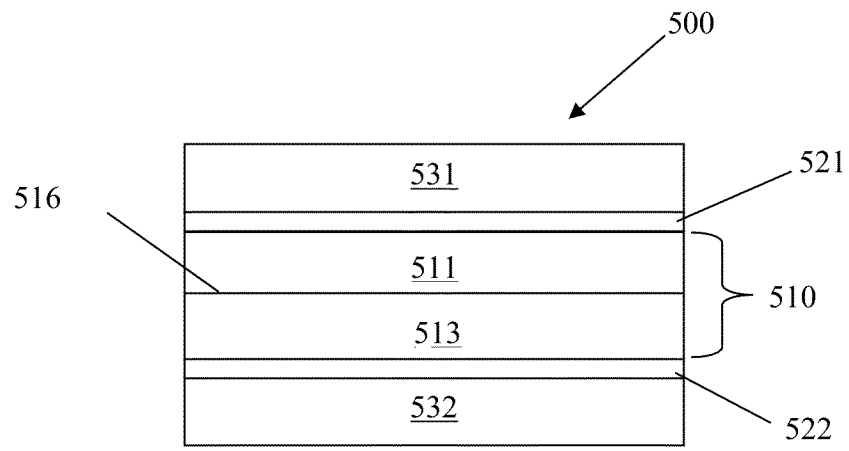
FIG. 5 is a schematic view of a nonvolatile resistive memory cell comprising an insulating bi-layer according to some embodiments.

FIG. 5 shows another embodiment of a memory cell 500, wherein the storage layer comprises one or more insulating bi-layers 510. As with the embodiment of FIG. 2, the insulating bi-layer 510 can be separated from the first and second electrodes 531, 532 by separation layers 521, 522. Each insulating bi-layer can comprise two layers of insulating material 511, 513. The layers 511, 513 should comprise different insulating materials such that an interface 516 is formed therebetween. In appropriately chosen insulating material layer combinations there can be large localized interface density of states, which will serve as the charge-trapping device. The insulating materials 511, 513 need not comprise 3*d* transition metal oxides, as other materials such as, for example, $SiO_2$, $Al_2O_3$, SiN or SiON, BN, $TiO_2$, TiON, can be utilized. For example, in some embodiment, the storage layer 510 comprises an insulating bi-layer including a layer of $SiO_2$ stacked upon a layer of $Al_2O_3$.

Figure 6:
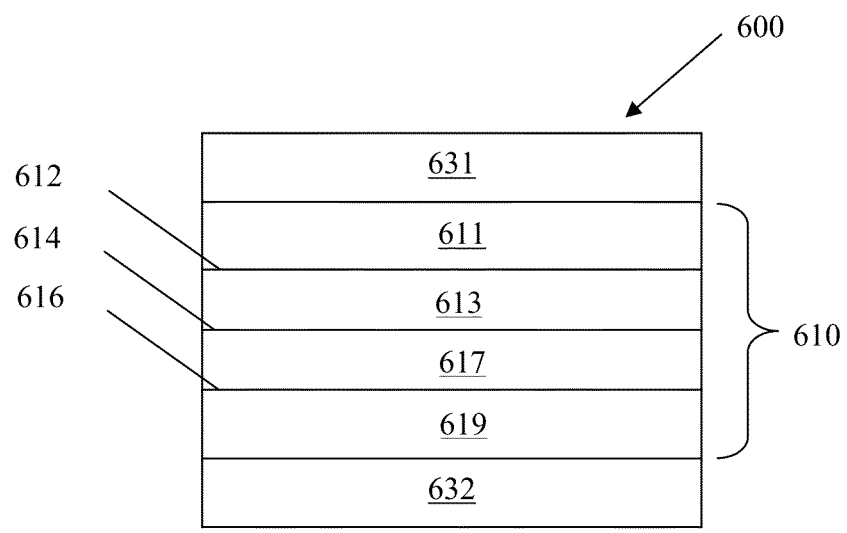
FIG. 6 is a schematic view of a nonvolatile resistive memory cell comprising an insulating multilayer according to some embodiments.

Another embodiment of a memory cell 600 including an insulating multilayer 610 is shown in FIG. 6. The insulating multilayer 610 can comprise a plurality of insulating layers 611, 613, 617, 619. The insulating layers can comprise two or more of the materials described above with reference to FIG. 5. In such a structure, every layer should comprise a material that is different from its neighbors, so that an interface 612, 614, 616 forms between each layer. For example, a multilayer 610 can comprise two insulating bi-layers wherein the first and third insulating material layers 611, 617 comprise $SiO_2$, and the second and fourth insulating material layers 613, 619 comprise $Al_2O_3$. In some embodiments, each of the insulating material layers comprise a different material. Likewise, the thicknesses of each insulating material can be the same or can vary. Moreover, embodiments comprising an insulating multilayer as the storage layer can include separation layers to separate the insulating multilayer 610 from the first and second electrodes 631, 632 such as, for example, the separation layers 521, 522 of the device 500 in FIG. 5.

Figure 7:
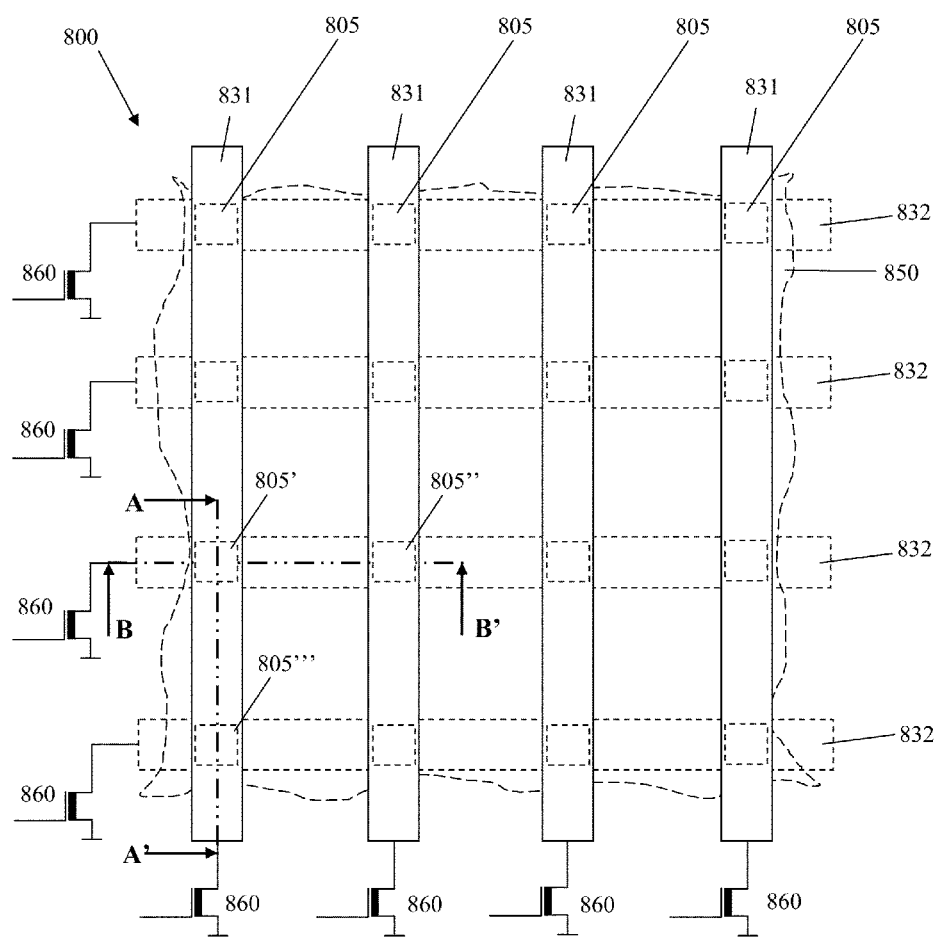
FIG. 7 is a top plan view of a nonvolatile memory device comprising a cross-point memory architecture according to some embodiments.
Figure 8A:
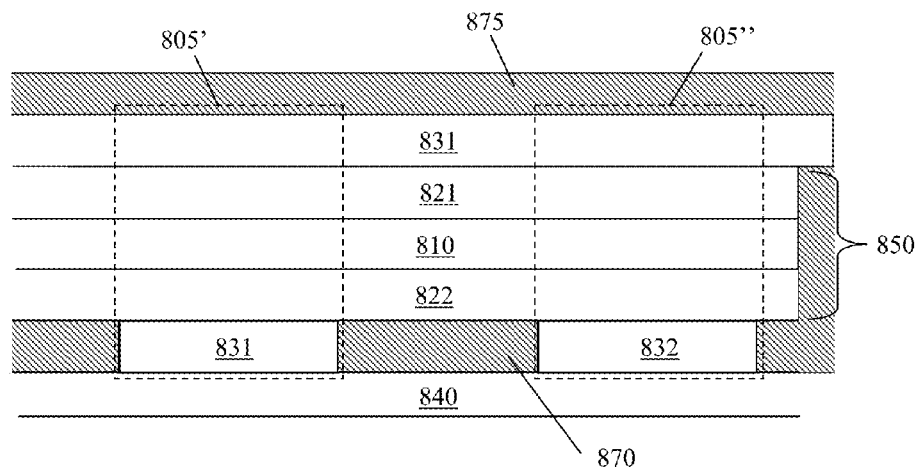
FIG. 8A is a cross-sectional view of the nonvolatile memory device of FIG. 7 taken along line A-A'.
Figure 8B:
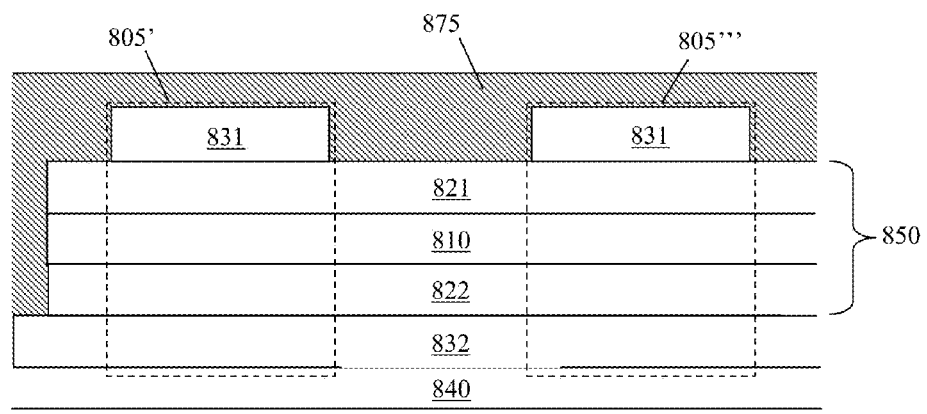
FIG. 8B is a cross-sectional view of the nonvolatile memory device of FIG. 7 taken along line B-B'.

Embodiments of nonvolatile memory cells according to the present invention can be incorporated into cross-point memory architectures, such as the nonvolatile memory device 800, shown in the schematic views of FIGS. 7, 8A, and 8B. FIG. 8A is a cross-sectional view taken along line A-A' of FIG. 7, and FIG. 8B is a cross-sectional view taken along line B-B' of FIG. 7.

The nonvolatile memory device 800, comprises a plurality of memory cells 805 on a substrate 840. The memory cells 805 are located where a plurality of spaced apart top electrodes 831 cross over a plurality of spaced apart bottom electrodes 832. A switchable resistance medium 850 is interposed between the top and bottom electrodes 831, 832. The top and bottom electrodes 831, 832 can serve as bit and word lines, respectively or vice versa, addressable via independent transistor (e.g. MOSFET) switches 860. Thus, each memory cell 805 is independently accessible. The switchable resistance medium 850 can comprise resistive storage layer 810 and separation layers 821, 822 according to embodiments of the above-described nonvolatile memory cells. For example, the cells 805', 805", 805''' shown in FIGS. 8A and 8B correspond with the structure disclosed in FIG. 2.

In some embodiments, the switchable resistance medium 850 is continuous across one or more cells. Preferably, the switchable resistance medium 850 is continuous across the entire nonvolatile memory device to facilitate ease of fabrication. Memory cells according to embodiments of the present invention allow for the use of continuous storage layers because, as described above, the thinner storage layers have a lateral resistance (i.e. the resistance between memory cell 805' and memory cell 805" in FIG. 8A) sufficient to prevent cross-talk between cells, even at high bit densities (i.e. when the cells are closely packed). A continuous switchable resistance medium 850 can make device fabrication easier because it removes the need to pattern the storage layer 810. This fact is considered to be a significant advantage of memory cells according to embodiments of the present invention because one of the most severe limitations facing the scalability of small memory cell sizes (i.e. high bit densities) is the difficulty associated with patterning thick TMO films. Accordingly, the only patterning required to fabricate devices such as that shown in FIG. 7 is the patterning of the bottom and top electrodes 831, 832 which comprise materials that easy to pattern (e.g. metals).

While the above disclosed nonvolatile memory device was discussed with reference to a device 800 having a continuous switchable resistance medium, embodiments should not be limited to such devices. That is, some embodiments can comprise patterned memory cells. In such case, each memory cell can be isolated from neighboring memory cells with a dielectric or other insulating material between each cell. Alternatively, only a portion of each memory cell can be patterned. For example, a memory device can comprise a continuous storage layer having patterned separation layers and electrodes disposed thereon.

The fabrication of devices according to above-described embodiments can be accomplished with common semiconductor fabrication techniques. Generally the devices can be formed by a direct deposition of each layer followed by a lithography defined milling process. However, optimization of each layer composition and structure may require additional processing such as, for example, annealing, ion implantation, planarizing, or other processes.

An exemplary fabrication process can proceed as follows, with reference to FIGS. 8A and 8B. First, the substrate 840 can be prepared and the bottom electrode material can be deposited thereon. The bottom electrodes 832 can be patterned and formed, e.g. by photolithography. An insulating material 870 can be backfilled within the gaps between the bottom electrodes 832. A milling or planarization process may be required to expose the bottom electrodes from the insulating material 870. The layers of the switchable resistance medium 850 can then be deposited upon the bottom electrodes 832 and insulating material 870. This may include multiple deposition steps and can include further processes needed to create the layers of the switchable resistance medium 850. Then the top electrode 831 material can be deposited on the switchable resistance medium 850. The top electrodes can be patterned and formed, e.g. by photolithography. An insulating material 875 can be backfilled over and between the top electrodes 831 to isolate the device.

Figure 9A:
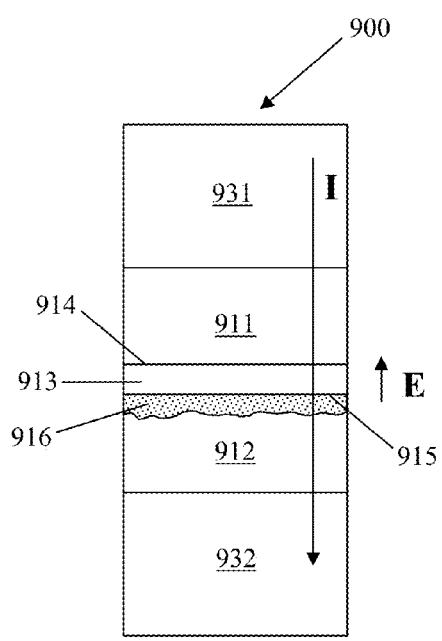
FIG. 9A is a schematic view of a nonvolatile resistive memory cell comprising a changeable internal electric field E according to some embodiments.
Figure 9B:
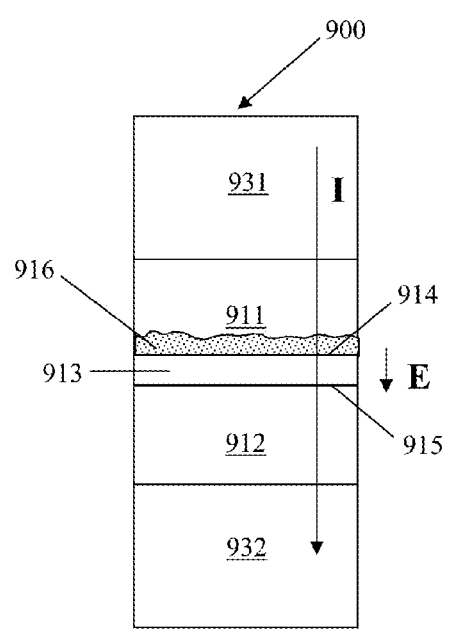
FIG. 9B is a schematic view of the nonvolatile resistive memory cell of FIG. 9A, wherein the direction of the internal electric field E has been changed according to some embodiments.

In another aspect, some embodiments comprise a nonvolatile memory cell 900 such as that shown in FIGS. 9A and 9B. In such embodiments, the memory cell 900 comprises first and second metallic layers 911, 912 between first and second electrodes 931, 932. An interlayer 913 is interposed between the first and second metallic layers 911, 912, such that first and second interfaces 914, 915 are formed. In addition, a charge carrier material 916 is added within the memory cell 900, for example, as a dopant, in the first or second metallic layer 911, 912 at the first or second interface 914, 915. For example, in FIG. 9A, charge carrier 916 is located within the second metal layer 912 at the second interface 915. The charge carrier 916 has been selected such that its presence at one of the interfaces 914, 915 creates a charge imbalance across the interlayer 913 in a direction that depends upon the interface at which the charge carrier resides. This charge imbalance manifests as an internal electric field E.

Metallic layers 911, 912 of the cell 900 can comprise generally any metal or metal containing compound or nonmetal, such as, for example, a metal oxide or alloy thereof. In some embodiments, the first and second layers 911, 912 comprise a TMO, such as, for example, $LiCoO_2$, $TiO_{2-x}$, $Ta_2O_5$, $NiO_x$, or $Nb_2O_5$. The thickness of metallic layers 911, 912 according to some embodiments, can be from about 1 nm to about 100 nm. In some embodiments, the first metallic layer 911 can comprise a metallic layer that is different from the second metallic layer 912. The interlayer 913 can comprise a TMO, however the interlayer 913 should be different from each of the first and second layers 911, 912 so as to form first and second interfaces 914, 915. The interlayer 913 can comprise a metallic layer such as Ru, Ta, LiCo or its alloys or a non-metallic layer such as, for example, C. The interlayer 913 is generally thinner than the metallic layers 911, 912 and can have a thickness ranging from a monolayer (e.g. approximately 3 Angstroms) to up to about 20 nm. The charge carrier material 916 can comprise Li, O, or F. The charge carrier material 916 can be applied to one of the metallic layers 911, 912 by generally any suitable process known in the field such as, for example, ion implantation.

Figure 9C:
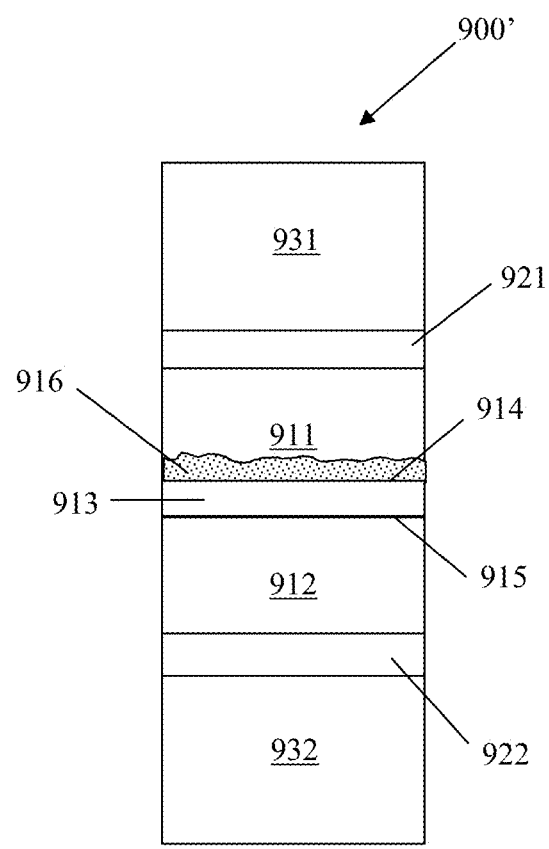
FIG. 9C is a schematic view of a nonvolatile resistive memory cell comprising a changeable internal electric field E and additional separation layers according to some embodiments.

Some embodiments, such as the nonvolatile memory cell 900' of FIG. 9C, can further comprise separation layers 921, 922 interposed between the metallic layers 911, 912 and electrodes 931, 932. Such separation layers 921, 922 can comprise the same materials as the interlayer 913, or the separation layers 121, 122 of FIG. 1. In operation the separation layers 921, 922 function similar to the separation layers 121, 122 of FIG. 1 (i.e. they trap charge within the storage device while allowing for tunneling of current therethrough).

The operation of the memory cells 900, 900' of FIGS. 9A-9C will now be discussed. As described above, a nonvolatile memory cell 900, 900' having excess dopant 916 at second interface 915 will generate an internal electric field E about the interlayer 913 within the cell. The direction and magnitude of the internal electric field E depends on the polarity and quantity of dopant present within the cell. With respect to FIG. 9A, a current I applied opposite such a field E experiences a high resistance state (HRS) because it must overcome this field to propagate through the memory cell 900. In contrast, as illustrated in FIG. 9B, when the dopant 916 is located at the first interface 914 a current I applied in the same direction is now passing in the same direction as the internal electric field E. In this state, the applied current I need not overcome the internal electric field E (and indeed may be helped by it) and therefore experiences a low resistance state (LRS) when passing through the cell 900. Accordingly, binary states (e.g. logic "0" and "1") can be stored within the cell 900, 900' based upon the direction of the internal electric field E, which is determined by the location of the dopant 916 within the cell 900, 900'.

Memory state switching can be accomplished in memory cells such as those of FIGS. 9A-9C by causing the charge carrier 916 to relocate within the memory cell 900, 900'. For example, with the charge carrier 916 initially located in the second metallic layer 912 at the second interface 915, as in FIG. 9A, the application of a sufficiently large potential about the cell can cause the charge carrier material 916 to dislodge and traverse the interlayer 913. The charge carrier material 916 then combines with the first metallic layer 911 at the first interface 914 resulting in the memory cell 900 illustrated in FIG. 9B.

Although the above disclosed embodiments are illustrated with reference to nonvolatile applications including a large number of read-write cycles (e.g. HDDs, flash memory, RAM), the disclosed structures can also be applied to write-once devices. For example, with respect to the nonvolatile memory cell 900 as shown in FIGS. 9A and 9B, the dopant concentration and the thickness of the metallic layers can be tuned to create different bias voltage thresholds. Thus, some nonvolatile memory cells can be provided with threshold voltages effectively providing for write-once operation, while others can be optimized for rewritable applications.

Although the present invention has been described in considerable detail with reference to certain disclosed embodiments, the disclosed embodiments have been presented for purposes of illustration and not limitation and other embodiments of the invention are possible. One skilled in the art will appreciate that various additional changes, adaptations, and modifications that may be made without departing from the spirit of the invention and the scope of the appended claims.

What is claimed is:

1. A nonvolatile memory cell comprising:
   first and second electrodes;
   first and second resistive storage layers interposed between the first and second electrodes; and
   first, second, and third separation layers, the first separation layer being interposed between the first electrode and the first resistive storage layer, the second separation layer being interposed between the second resistive storage layer and the second electrode, and the third separation layer being interposed between the first resistive storage layer and the second resistive storage layer;
   wherein,
      the first separation layer extends between the first electrode and the first resistive storage layer;
      the second separation layer extends between the second resistive storage layer and the second electrode;
      the third separation layer extends between the first resistive storage layer and the second resistive storage layer; and
      the first, second, and third separation layers are configured to terminate defect clusters formed within the corresponding first and second resistive storage layers to reduce leakage of trapped charge from the storage layers.

2. The nonvolatile memory cell of claim 1, wherein one or more of the first, second, and third separation layers comprise an insulating layer.

3. The nonvolatile memory cell of claim 1, wherein at least one of the first resistive storage layer and the second resistive storage layer comprises a transition metal oxide (TMO) storage layer.

4. The nonvolatile memory cell of claim 1, wherein at least one of the first resistive storage layer and the second resistive storage layer comprises a doped TMO storage layer.

5. A nonvolatile memory cell comprising:
   first and second electrodes;
   a resistive storage layer interposed between the first and second electrodes; and
   first and second separation layers, the first separation layer being interposed between the first electrode and the resistive storage layer, and the second separation layer being interposed between the resistive storage layer and the second electrode;
   wherein,
      the resistive storage layer comprises a granular film comprising a plurality of nano-sized grains embedded in an insulating matrix;
      the first separation layer extends between the first electrode and the resistive storage layer;
      the second separation layer extends between the resistive storage layer and the second electrode; and
      the first and second separation layers are configured to terminate defect clusters formed within the resistive storage layer to reduce leakage of trapped charge from the storage layer.

6. A nonvolatile memory cell comprising:
   first and second electrodes;
   first and second metallic layers interposed between the first and second electrodes;
   an interlayer interposed between the first and second metallic layers and forming a first interface between the interlayer and the first metallic layer and a second interface between the interlayer and the second metallic layer; and one or more separation layers extending between one or more of the following: 1) the first electrode and one of the first and second metallic layers, and 2) the second electrode and the other of the first and second metallic layers, wherein one of the first or second metallic layers is doped with a charge carrier at the first or second interface, respectively, such that an electric potential exists across the interlayer, the direction of the electric potential being switchable by causing the charge carrier to cross the interlayer to the opposite interface and wherein the one or more separation layers comprise an insulating layer configured to terminate defect clusters formed within the corresponding first and/or second metallic layers to reduce leakage of trapped charge from the metallic layers.

7. The nonvolatile memory cell of claim 6, wherein the charge carrier is selected from the group consisting of Li, O, and F.

8. The nonvolatile memory cell of claim 6, wherein the interlayer comprises a transition metal oxide.

9. The nonvolatile memory cell of claim 6, wherein the first metallic layer comprises a transition metal oxide and the second metallic layer comprises a transition metal oxide.

10. The nonvolatile memory cell of claim 6, wherein the first and second metallic layers comprise the same material.

11. The nonvolatile memory cell of claim 6, wherein one or more of the first and second metallic layers comprise a metallic alloy.

12. The nonvolatile memory cell of claim 6, wherein the one or more separation layers comprise two separation layers, one of the two separation layers extending between each of the following: 1) the first electrode and the one of the first and second metallic layers, and 2) the second electrode and the other of the first and second metallic layers.

13. The nonvolatile memory cell of claim 5, wherein one or more of the first and second separation layers comprise an insulating layer.

14. The nonvolatile memory cell of claim 5, wherein the insulating matrix comprises $SiO_2$, $Al_2O_3$, or MgO.

15. The nonvolatile memory cell of claim 5, wherein the plurality of nano-sized grains comprise semiconductive grains and/or metallic grains.

16. The nonvolatile memory cell of claim 5, wherein the nano-sized grains are immiscible with the insulating matrix.

17. The nonvolatile memory cell of claim 16, wherein the nano-sized grains comprise Fe and the insulating matrix comprises $SiO_2$.

* * * * *